United States Patent [19]

Sugino et al.

[11] 4,358,850
[45] Nov. 9, 1982

[54] TERRACED SUBSTRATE SEMICONDUCTOR LASER

[75] Inventors: Takashi Sugino; Masaru Wada, both of Takatsuki; Hirokazu Shimizu, Toyonaka; Kunio Itoh, Uji, all of Japan

[73] Assignee: Matsushita Electric Industrial Co., Ltd., Kadoma, Japan

[21] Appl. No.: 185,921

[22] Filed: Sep. 10, 1980

[30] Foreign Application Priority Data

Sep. 18, 1979 [JP] Japan ................................ 54-119872

[51] Int. Cl.³ .............................................. H01S 3/19
[52] U.S. Cl. ....................................... 372/45; 357/17; 372/46
[58] Field of Search ................... 331/94.5 H; 372/46, 372/45; 357/17

[56] References Cited

U.S. PATENT DOCUMENTS 4,296,387 10/1981 Sugino et al. .................. 331/94.5 H Primary Examiner—James W. Davie
Attorney, Agent, or Firm—Cushman, Darby & Cushman

[57] ABSTRACT

In a semiconductor laser comprising a terrace-shaped semiconductor substrate, a first clad layer formed on the semiconductor substrate, an active layer formed on the first clad layer and having two discontinuity places at bending portions of the first clad layer, a second clad layer formed on the active layer, and a current injection electrode above a lasing region in the active layer, the improvement is that a stable fundamental transverse lasing mode and a circular laser beam are obtainable from the lasing region definitely separated by two discontinuity places in the active layer.

5 Claims, 12 Drawing Figures

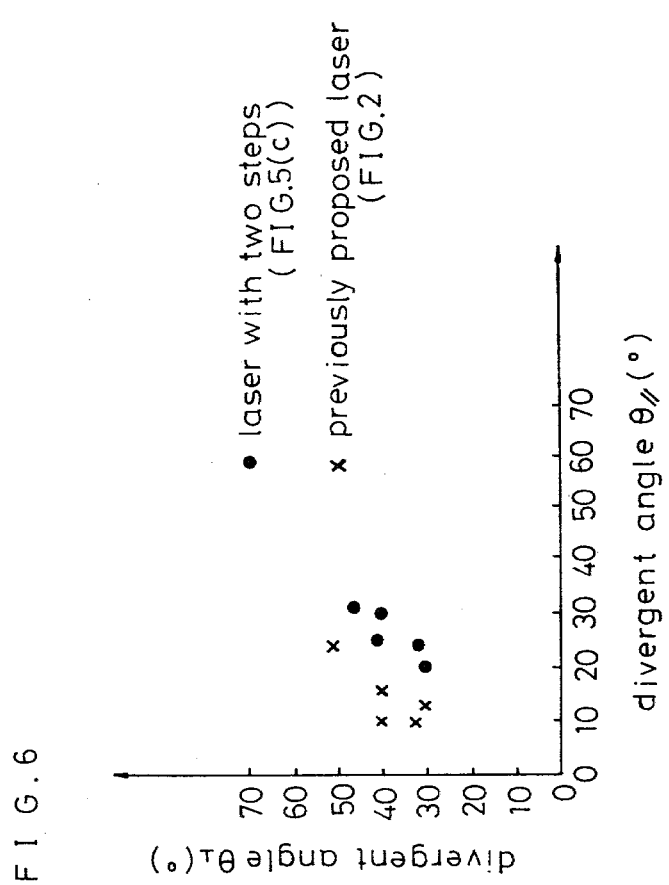

TERRACED SUBSTRATE SEMICONDUCTOR LASER

BACKGROUND OF THE INVENTION

1. Field of the Invention

The present invention relates to a semiconductor laser. More particularly, it relates to an improvement in a semiconductor laser made by a liquid phase epitaxial growth method.

2. Prior Art

Together with remarkable progress of optical communication technology and disk-type video recording apparatus technology, semiconductor lasers are regarded as the most important devices for light sources to be used in such technical fields. Accordingly, there are great requirements in reliability and performance of such semiconductor lasers. That is, lasers of longer lifetime and lasing with a more stable fundamental mode are required more and more.

Various types of semiconductor lasers have been hitherto developed in order to realize lasing operation with a stable fundamental mode. As one of the typical laser structures, a semiconductor laser was proposed in the U.S. patent application of Ser. No. 947,419 (now patented under U.S. Pat. No. 4,188,244 for Itoh et al.). This semiconductor laser is fabricated by the steps of shaping an active layer in a stripe form and growing a high resistive material on both sides of the stripe-shaped active region. The high resistive material has an energy band gap larger and a refractive index smaller than the counterparts of the active region, and therefore the injected current and the lased light are well confined in the active region. The method of forming such a semiconductor laser comprises complicated processing steps such as a growing step of the high resistive material. Besides, there are other shortcomings in such a conventional semiconductor laser (as discussed in the descriptions in the U.S. patent application of Ser. No. 40,182, now U.S. Pat. No. 4,296,387).

Some improvements were proposed in order to eliminate the conventional shortcomings in the semiconductor laser with the buried-in stripe shape active region. One example of such an improved semiconductor laser is shown in FIG. 1. The conventional semiconductor laser of FIG. 1 comprises the following parts:

a substrate 1 of . . . n-GaAs,
a first clad layer 2 of . . . n-Ga$_{1-x}$Al$_x$As,
an active layer 3 of . . . non-doped Ga$_{1-y}$Al$_y$As,
a second clad layer 4 of . . . p-Ga$_{1-z}$Al$_z$As,
a contacting layer 5 of . . . p-GaAs,
an isolation layer 6 of . . . SiO$_2$, and
electrode contacting layers 7 and 8.

The substrate 1 has a groove 9, on which the double-hetero-structure is formed by crystal growths. It is possible to bury the active layer 3 in the groove 9 by taking advantage of the fact that the crystal growth rate at the bending edges on both sides of the groove 9 is smaller than other flat portions. A lasing operation is obtainable in the active region 3' buried in the groove 9, by providing a stripe-shaped electrode contacting layer 7 for current injection right above the groove 9.

The semiconductor laser of the structure shown in FIG. 1 has the following drawbacks. It is difficult to form the active region 3' in a narrow space between the bending edges on both sides of the groove 9. Further, since the active layer is largely warped at the active region 3' in the groove 9, it is difficult to reproduce fundamental transverse mode lasing well. In addition, it is further difficult to control the crystal growth for the active region 3' with the warped shape. When a crystal growth is carried out in and around the groove 9, one needs to control three different growth rates for the bottom and the sloped portions of the groove 9 and for the flat portions on both sides of the groove 9. Although these crystal growth rates can be varied by changing the supersaturation degree of the epitaxial solution, the crystal growth rates for the three dominant portions must be controlled solely by the supersaturation degree of the epitaxial solution, once the shape of the groove 9 is determined. That is, one certain shape of the active layer 3 is obtained for one certain condition of the supersaturation degree, and the shape of the active layer 3 does not always result in the desired one shown in FIG. 1. Therefore, the warped active region 3' can not be reproduced well.

SUMMARY OF THE INVENTION

The present invention can provide a semiconductor laser with a terraced substrate structure and capable of stable lasing by the fundamental mode.

The present invention can also provide a semiconductor laser producing a laser beam with a far field pattern of nearly a circle.

BRIEF EXPLANATION OF THE DRAWINGS

FIG. 6 is a graph showing a relationship between a divergent angle in a parallel direction to the active junction and a divergent angle in a perpendicular direction to the same, both in the semiconductor lasers of FIG. 2 and FIG. 5(c).

DESCRIPTION OF THE PREFERRED EMBODIMENT

A semiconductor laser in accordance with the present invention comprises a terrace-shaped semiconductor substrate having an upper face, a lower face and a step part disposed between said upper face and said lower face, a first clad layer formed on said semiconductor substrate to have an upper flat part, a lower flat part and a central sloped surface part disposed between said upper flat part and said lower flat part, said upper flat part being on said upper face, said lower flat part being on said lower face, and said central sloped surface part being on said lower face and on said step part, an active layer formed on said first clad layer and having two discontinuity places on the parts which are on bending parts from said central sloped surface parts to said upper flat part and to said lower flat part, said active layer has a thickness on said central sloped surface part larger than those on said upper flat part and said lower flat part, said active layer including a lasing region on said central sloped surface part between said two discontinuity places, a second clad layer formed on said active layer, and
a current injection electrode disposed above said lasing region.

Figure 2:
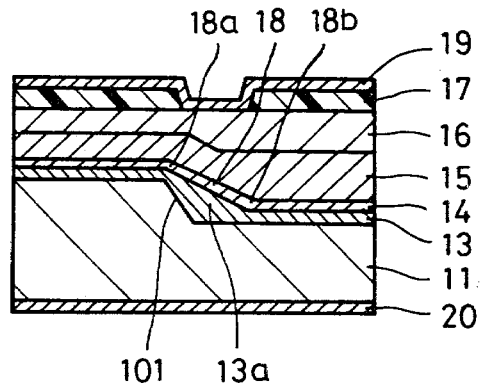
FIG. 2 is a sectional elevation view of a terraced substrate type semiconductor laser proposed in an assignee's senior U.S. application.

The present assignee has proposed a semiconductor laser with a simplified structure and capable of producing stable fundamental mode lasing in her senior United States patent application (Ser. No. 40,182). FIG. 2 shows a cross-sectional structure of a terrace structure type semiconductor laser proposed therein. It comprises the following parts:

a substrate 11 of . . . n-GaAs,
a first clad layer 13 of . . . n-$Ga_{1-x}Al_xAs$,
an active layer 14 of . . . non-doped $Ga_{1-y}Al_yAs$,
a second clad layer 15 of . . . p-$Ga_{1-z}Al_zAs$,
a contacting layer 16 of . . . p-GaAs,
a hetero-isolation layer 17 of . . . n-$Ga_{0.5}Al_{0.5}As$, and
electrode layers 19 and 20.

Stable transverse mode lasing is obtainable at an oblique lasing region 18 of the semiconductor laser over a wide range of an injection current. The layers 13, 14, 15, 16 and 17 are sequentially formed by epitaxial growths on the substrate 11, which is formed in a terrace shape having a step part 101. The first clad layer 13 has a sloped surface part or triangular part 13a at the step part 101, and accordingly the active layer 14 is formed on the triangular part 13a, so as to have the oblique lasing region 18 defined between a higher bending portion 18a and a lower bending portion 18b. In this structure, the thickness of the first clad layer 13 under the lasing region 18 becomes thicker than those under other parts of the active layer 14, and hence divergence of lased light measured in a plane perpendicular to a junction between the active layer 14 and the second clad layer 15 is small. This is because the triangular part 13a of the first clad layer 13 at the thickest part is about 1 μm thick, and a lower horizontal part and an upper horizontal part of the first clad layer 13 are 0.3 μm thick. Therefore, the light lased in the active layer 14 on the upper or lower horizontal part is absorbed in the substrate 11, while the light lased in the lasing region 18 on 1 μm thick triangular part 13a is not absorbed by the substrate 11 thus producing a single lasing spot. Furthermore, the lasing region 18 is thicker by about 20% than the horizontal parts, resulting in formation of a folded ridge-type light waveguide. The effective refractive index there is higher in the bent parts thus serving to further stabilize the lasing mode.

Figure 3A:
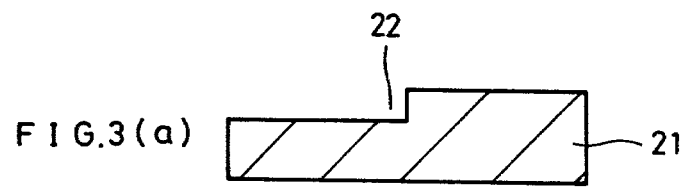
FIG. 3(a)-FIG. 3(c) are sectional elevation views showing steps of making a semiconductor laser embodying the present invention.
Figure 3B:
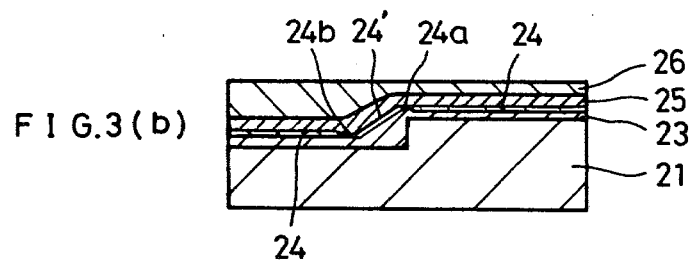
Figure 3C:
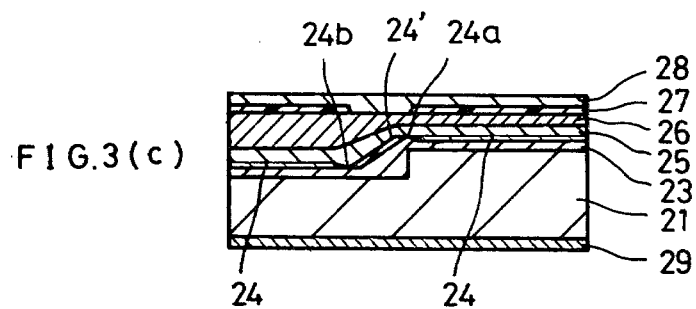
Figure 4A:
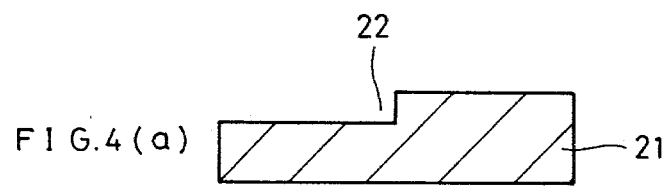
FIG. 4(a)-FIG. 4(c) are sectional elevation views showing steps of making another semiconductor laser embodying the present invention.
Figure 4B:
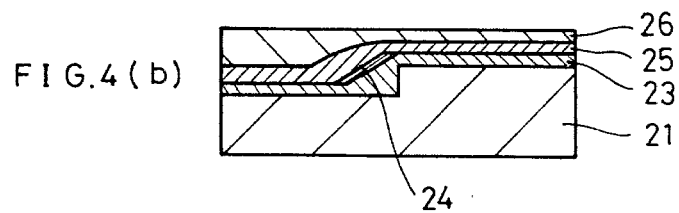
Figure 4C:
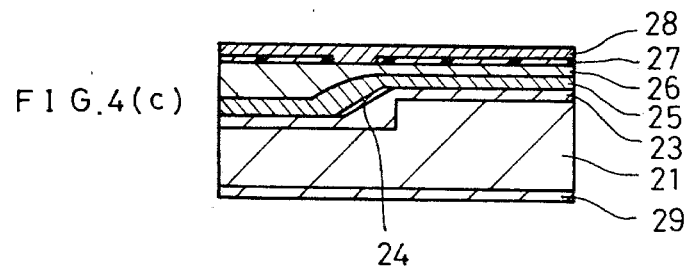

The present invention further proposes a new structure for a terrace-type semiconductor laser. The preferred embodiments will be described in detail by referring to the accompanying drawings. FIG. 3(a)-FIG. 3(c) are sectional elevation views showing steps of making a semiconductor laser in accordance with a first embodiment of the present invention. FIG. 4(a)-FIG. 4(c) are sectional elevation views showing steps of making another semiconductor laser in accordance with a second embodiment of the present invention.

Figure 1:
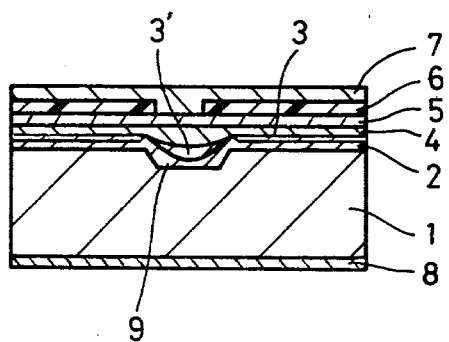
FIG. 1 is a sectional elevation view of a conventional buried-in type semiconductor laser.

Methods of making two semiconductor lasers are briefly described in the following. Detailed descriptions will be given later. As shown in FIG. 3(a) or FIG. 4(a), an n-type single crystalline GaAs substrate 21 is processed to have a stepped terrace 22. An n-type clad layer 23, an active layer 24, a p-type clad layer 25 and a p-type contacting layer 26 are sequentially grown on the surface of the n-type substrate 21 to obtain a structure shown in FIG. 3(b) or FIG. 4(b). Growth rates of the active layer 24 at the upper and lower bending portions are smaller than those at the horizontal portions and the sloped portion. Therefore, when the thickness of the active layer 24 on the upper and lower horizontal portions is controlled to be extremely thin during the crystal growth, the resultant active layer 24 possesses two discontinuity places 24a and 24b at the bending portions. Such extremely thin parts 24a, 24b of the active layer 24 can be formed, for example by minimizing the supersaturation degree of the Ga solution and carring out the growth for a specified long time. The active layer 24 between two discontinuity places 24a and 24b is a straight active region 24', contrary to the warped active region 3' shown in FIG. 1. The distance between two discontinuity places 24a and 24b can be selected by varying the height of the stepped terrace 22.

The active layer 24 has discontinuity places 24a and 24b at the upper and lower bending portions in FIG. 3(b). The width of the active region 24' is limited by the active layer 24 between two discontinuity places 24a and 24b thereby improving light confinement. It is similarly effective, when the active layer 24 possesses constricted parts thinner than other parts at the upper and lower bending portions, in place of the case that the thickness of the active layer 24 at the discontinuity place 24a and 24b is almost zero. Therefore, in this invention, the word discontinuity part or place is defined to include constricted part or place. Although the discontinuity place 24a at the upper bending portion can be obtained definitely by making the active layer 24 sufficiently thin, there is a tendency that the discontinuity place 24b at the lower bending portion is slightly difficult to obtain than the former place. It is confirmed that the light confinement is also effective when the discontinuity place 24a is formed only at the upper bending portion. In the case of FIG. 4(b), the thickness of the active layer 24 on the upper and lower horizontal portions is extremely small. That is, the active layer 24 is formed substantially only at the sloped portion. Such extremely thin horizontal parts of the active layer 24 can be formed, for example by minimizing the supersaturation degree of the Ga solution to form the active layer 24.

Following the step shown in FIG. 3(b) or FIG. 4(b), an insulation layer or an n-type semiconductor layer 27 is formed on the epitaxially grown crystal surface. Then the layer 27 is etched to make stripe-shaped openings right above the effective active region 24' for current injection. After diffusing Zn atoms at the surface of the p-type contacting layer 26 exposed in a stripe form, a p-side ohmic electrode 28 is formed. Then, an n-side ohmic electrode 29 is formed thus completing the formation of the laser structure shown in FIG. 3(c) or FIG. 4(c).

A specific example of fabricating a semiconductor laser embodying the present invention is given below. The example is given for a semiconductor laser comprising an epitaxial layer of $Ga_{1-x}Al_xAs$ grown on an n-type GaAs substrate. A stepped terrace 22 of 1.5 μm in height is formed in an <011> direction on the (100) surface of an n-type GaAs substrate 21 by use of chemical etching—FIG. 3(a).

Then, a first clad layer 23 of n-type $Ga_{0.65}Al_{0.35}As$ is grown by 0.1 μm in thickness (measured at the flat portion) by a liquid phase epitaxial method with a starting temperature of 845° C. and a cooling rate of 0.5°

C./min. Successively, an active layer 24 of non-doped Ga$_{0.96}$Al$_{0.04}$As is grown by 0.04 μm in thickness (measured at the sloped portion), a second clad layer 25 of p-type Ga$_{0.65}$Al$_{0.35}$As by 1 μm in thickness (measured at the flat portion), and a contacting layer 26 of p-type GaAs by 1 μm (measured at the flat portion), respectively. The resultant active layer 24 has two discontinuity places 24a and 24b 4 μm apart from each other at the upper and lower bending portions—FIG. 3(b).

Then, a Si$_3$N$_4$ film 27 is deposited by 3,000 Å in thickness on the contacting layer 26, and openings in a stripe form with 5 μm in width are formed in the Si$_3$N$_4$ film 27 right above the active layer 24 disposed on the sloped portion. Impurity diffusion by use of Zn atoms is made for the contacting layer 26 to obtain ohmic contact. A p-side electrode 28 is formed by vacuum evaporation of, for example Ti, Pt and Au, and an alloying process therefor. Finally, after etching the bottom face of the wafer, an n-side electrode 29 is formed by vacuum evaporation of, for example Au, Ge and Ni, and an alloying process therefor—FIG. 3(c).

The semiconductor laser structure shown in FIG. 4(a)–FIG. 4(c) is similarly obtained, however in this case more attention should be given to crystal growth control for an active layer 24. In both cases the Si$_3$N$_4$ film 27 can be replaced by an n-type semiconductor layer. The semiconductor lasers made by the steps shown in FIG. 3(a)–FIG. 3(c) and FIG. 4(a)–FIG. 4(c) are provided with the active layers 24 having discontinuity places 24a and 24b. Thus, the widths of the lasing regions are limited by them thereby improving light confinement and generating a stable fundamental lasing mode. Especially, it is possible to obtain an isotropic laser beam and a far field pattern of a circle in the lasing operation of the semiconductor laser in accordance with the present invention.

Figure 5A:
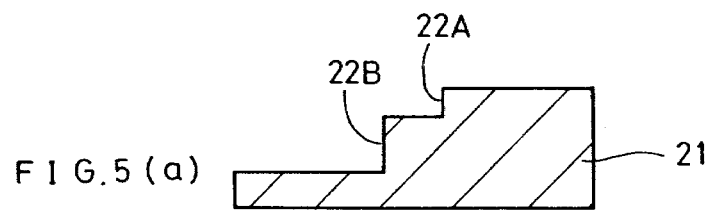
FIG. 5(a)-FIG. 5(c) are sectional elevation views showing steps of making still another semiconductor laser embodying the present invention.
Figure 5B:
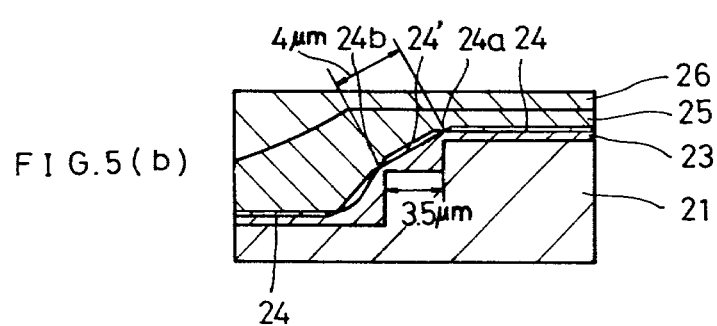
Figure 5C:
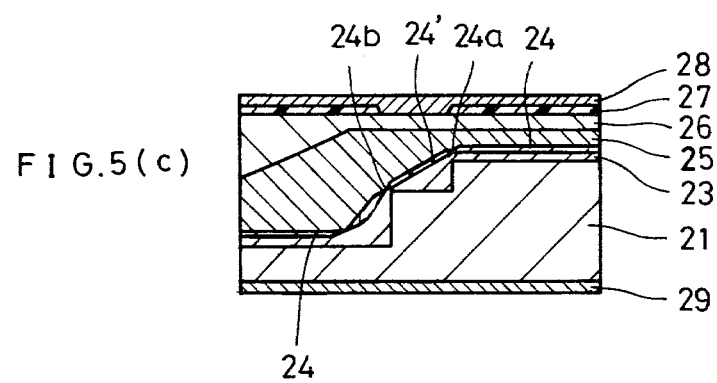

A specific example of fabricating a semiconductor laser of a third embodiment shown in FIG. 5(a)–FIG. 5(c) is described below. The third embodiment is concerned with a semiconductor laser using a semiconductor substrate with two step portions. An upper step 22a of 1.5 μm in height is formed in an <011> direction on the (100) surface of an n-type GaAs substrate 21 by chemical etching, and a lower step 22B of 3 μm in height is similarly formed—FIG. 5(a).

Then, a first clad layer 23 of n-type Ga$_{0.65}$Al$_{0.35}$As is grown by 0.1 μm in thickness (measured at the flat portion) by a liquid phase epitaxial method with a starting temperature of 845° C. and a cooling rate of 0.5° C./min. Successively, an active layer 24 of non-doped Ga$_{0.96}$Al$_{0.04}$As is grown by 0.1 μm in thickness (measured at the sloped portion above the upper step 22A), a second clad layer 25 of p-type Ga$_{0.65}$Al$_{0.35}$As by 1 μm in thickness (measured at the flat portion), and a contacting layer 26 of p-type GaAs by 1 μm (measured at the flat portion), respectively. The resultant active layer 24 is 0.07 μm in thickness on two sloped portions. In this specific example, a distance between the two steps 22A and 22B is set to be 3.5 μm. Thus, an active region 24' for a lasing region becomes 4 μm in width above the upper step 22A—FIG. 5(b).

Since the semiconductor laser structure in FIG. 5(b) is provided with two step portions, the active layer 24 surely has discontinuity places 24a and 24b at the upper projected portions of the upper and lower steps 22A and 22B, respectively. By the formation of these discontinuity places 24a and 24b in the active layer 24, a light confinement effect is similarly improved.

Then, a Si$_3$N$_4$ film 27 is deposited by 3,000 Å in thickness on the contacting layer 26, and openings in a stripe form with 4 μm in width are formed in the Si$_3$N$_4$ film 27 right above the active region 24' disposed on the sloped portion.

Impurity diffusion by use of Zn atoms is made for the contacting layer 26 to obtain ohmic contact. A p-side electrode 28 is formed by vacuum evaporation of, for example Ti, Pt and Au, and an alloying process therefor. Finally, after etching the bottom face of the substrate 21, an n-side electrode 29 is formed by vacuum evaporation of, for example Au, Ge and Ni, and an alloying process therefor—FIG. 5(c).

In the process described above, the Si$_3$N$_4$ film 27 can be replaced by an n-type semiconductor layer. The semiconductor laser prepared by the steps shown in FIG. 5(a)–FIG. 5(c) is provided with the active layer 24 including the active region 24' definitely separated at the discontinuity places 24a and 24b. Therefore, light confinement in the active region 24' is improved thereby generating a stable fundamental transverse lasing mode. The lineality in the characteristics of light output vs. injection current is maintained above a current value three times as high as the threshold value. Furthermore, it is possible to obtain an isotropic laser beam and a far field pattern of a circle in the lasing operation, in a better state than the case of the previously proposed semiconductor laser shown in FIG. 2.

FIG. 6 is a graph showing a relationship between a divergent angle $\theta \parallel$ in a direction parallel to the active junction and a divergent angle $\theta \perp$ in a direction perpendicular to the same, for five laser devices each from both semiconductor lasers of FIG. 2 and FIG. 5(c). It is seen from the graph that the ratio $\theta \perp / \theta \parallel$ (scale for isotropy of the laser beam) is improved to be about 1.5 for the case of the semiconductor laser of FIG. 5(c) whereas the counterpart of the previously proposed semiconductor laser of FIG. 2 is about 2.5. This means, the divergent angle $\theta \parallel$ in the parallel direction is enlarged in the semiconductor laser embodying the present invention thus enabling to obtain a laser beam of a circle.

The present invention is also distinctive in that the shape of the active region can easily be controlled. This is because a desired shape for the active region is easily obtainable by controlling the growth rates for the step portion and the upper and lower flat portions. And the ratio of growth rates for two portions is variable continuously by changing the supersaturation degree of the solution used for the epitaxial growth.

What is claimed is:

1. In a semiconductor laser the improvement comprising:
   a terrace-shaped semiconductor substrate having an upper face, a lower face and a step part disposed between said upper face and said lower face,
   a first clad layer formed on said semiconductor substrate to have an upper flat part, a lower flat part and a central sloped surface part disposed between said upper flat part and said lower flat part, said upper flat part being on said upper face, said lower flat part being on said lower face, and said central sloped surface part being on said lower face and on said step part,
   an active layer formed on said first clad layer and having two discontinuity places on the parts which are on bending parts from said central sloped surface parts to said upper flat part and to said lower flat part, said active layer has a thickness on said central sloped surface part larger than those on said upper flat part and said lower flat part, said active layer including a lasing region on said central sloped surface part between said two discontinuity places, a second clad layer formed on said active layer, and a current injection electrode disposed above said lasing region.

2. A semiconductor laser in accordance with claim 1 wherein in said active layer, the parts other than said lasing region substantially thinner than said lasing region.

3. A semiconductor laser in accordance with claim 1, wherein said semiconductor substrate is of GaAs and said active layer is of GaAlAs.

4. In a semiconductor laser the improvement comprising:

a terrace-shaped semiconductor substrate having an uppermost face, an intermediate face, a lowest face, a first step and a second step, said first step being disposed between said uppermost face and said intermediate face, and said second step being disposed between said intermediate face and said lowest face, a first clad layer formed on said semiconductor substrate to have an upper flat part, a lower flat part and a central sloped surface part disposed between said upper flat part and said lower flat part, said upper flat part being on said uppermost face, said lower flat part being on said lowest face, and said central sloped surface part being on said first step, said intermediate face, said second step and said lowest face, an active layer formed on said first clad layer and having discontinuity places above edges of said first step and said second step, said active layer including a lasing region on said central sloped surface part of said first clad layer between said two discontinuity places, a second clad layer formed on said active layer, and a current injection electrode disposed above said lasing region.

5. A semiconductor laser in accordance with claim 4, wherein said semiconductor substrate is of GaAs and said active layer is of GaAlAs.

* * * * *